United States Patent
Ramachandran et al.

(10) Patent No.: US 11,069,665 B2
(45) Date of Patent: Jul. 20, 2021

(54) TRIMMABLE BANKED CAPACITOR

(71) Applicant: Apple Inc., Cupertino, CA (US)

(72) Inventors: Vidhya Ramachandran, Cupertino, CA (US); Chonghua Zhong, Cupertino, CA (US); Jun Zhai, Cupertino, CA (US); Long Huang, San Jose, CA (US); Mengzhi Pang, Cupertino, CA (US); Rohan U. Mandrekar, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 91 days.

(21) Appl. No.: 16/205,679

(22) Filed: Nov. 30, 2018

(65) Prior Publication Data

US 2020/0176427 A1    Jun. 4, 2020

(51) Int. Cl.
| | |
|---|---|
| *H01L 25/16* | (2006.01) |
| *G01R 31/64* | (2020.01) |
| *H01L 23/525* | (2006.01) |
| *H01L 21/66* | (2006.01) |
| *H01L 49/02* | (2006.01) |

(52) U.S. Cl.
CPC .............. *H01L 25/16* (2013.01); *G01R 31/64* (2020.01); *H01L 22/22* (2013.01); *H01L 23/5258* (2013.01); *H01L 28/40* (2013.01)

(58) Field of Classification Search
None
See application file for complete search history.

(56) References Cited

U.S. PATENT DOCUMENTS

| | | | |
|---|---|---|---|
| 6,759,257 B2 | 7/2004 | McCormack et al. | |
| 8,945,998 B2 | 2/2015 | Hsu et al. | |
| 9,148,167 B2 | 9/2015 | Aruga et al. | |
| 2004/0150966 A1* | 8/2004 | Hu | H01L 23/5389 361/763 |
| 2013/0295727 A1* | 11/2013 | Hsu | H01L 23/5382 438/130 |

* cited by examiner

*Primary Examiner* — Bo B Jang
(74) *Attorney, Agent, or Firm* — Aikin & Gallant, LLP

(57) ABSTRACT

Integrated passive devices (IPDs), electronic packaging structures, and methods of testing IPDs are described. In an embodiment, an electronic package structure includes an IPD with an array of capacitor banks that are electrically separate in the IPD, and a package routing that includes an interconnect electrically connected to an IC and a plurality of the capacitor banks in parallel.

23 Claims, 7 Drawing Sheets

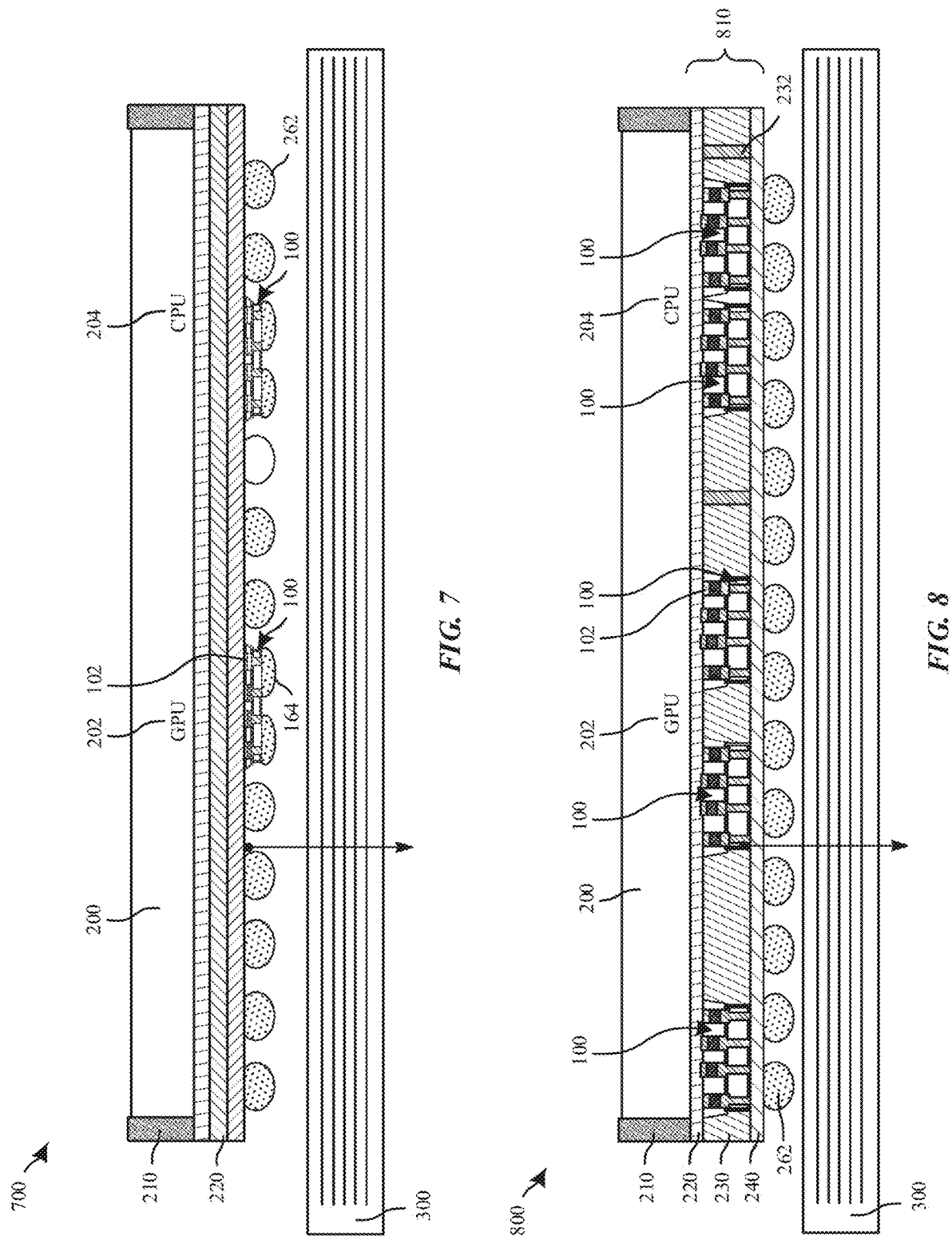

TRIMMABLE BANKED CAPACITOR

BACKGROUND

Field

Embodiments described herein relate to semiconductor packages and modules with integrated passive devices, and more particularly to discrete integrated passive devices with trimmable capacitor banks.

Background Information

The current market demand for portable and mobile electronic devices such as mobile phones, personal digital assistants (PDAs), digital cameras, portable players, gaming, and other mobile devices requires the integration of more performance and features into increasingly smaller spaces. In such configurations capacitor arrays are commonly located in close proximity to the integrated circuits (ICs) for a variety of applications such as for voltage regulation, analog to digital converters, and bypass capacitors to rapidly supply charge to the ICs. In one implementation, such capacitor arrays are integrated into a custom interposer in order to locate the capacitors close to the chips containing the target ICs and reduce inductance.

SUMMARY

Integrated passive devices (IPDs), electronic packaging structures, and methods of testing IPDs are described. In an embodiment, an IPD includes a mounting surface including an array of terminals, an array of capacitor banks, and IPD routing connecting the array of capacitor banks to the array of terminals. In accordance with embodiments, each capacitor bank of the array of capacitor banks may be electrically separate. Each capacitor bank of the array of capacitor banks may occupy a same amount of area, and each edge of each capacitor bank abuts a maximum of one neighboring capacitor bank edge. Each capacitor bank may include multiple capacitors in parallel. In an embodiment, the IPD includes a corresponding pair of terminals for each capacitor bank. Alternatively, the array of terminals can include a pair of terminals for each corresponding capacitor.

Capacitor banks with defective capacitors can be trimmed. In an embodiment, an array of fuses is located between the array of capacitor banks and the array of terminals. In this manner, a fuse can be blown for a defective capacitor bank. In an embodiment, the IPD includes an array of solder bumps on the array of terminals, and an insulating layer separating at least one terminal from a corresponding solder bump for a defective capacitor bank.

In an embodiment, an electronic package structure includes a first die including a first integrated circuit (IC), a package routing on the first die, and an IPD bonded to the package routing. The IPD includes an array of capacitor banks, an array of terminals, and IPD routing connecting the array of capacitor banks to the array of terminals in which each capacitor bank of the array of capacitor banks is electrically separate in the IPD. In an embodiment, the package routing includes a first interconnect electrically connected to the first IC and a first plurality of the array of capacitor banks in parallel.

In an embodiment, the first die further includes a second IC, and the package routing includes a second interconnect electrically connected to the second IC and a second plurality of the array of capacitor banks in parallel. In an embodiment, the electronic package includes a second die that includes a second IC, and the package routing is additionally on the second die. In one implementation, the package routing includes a second interconnect electrically connected to the second IC and a second plurality of the array of capacitor banks in parallel. In another implementation, a second IPD is bonded to the package routing, the second IPD includes a second array of second capacitor banks, and each second capacitor bank is electrically separate in the second IPD. Furthermore, the package routing can include a second interconnect electrically connected to the second IC and a plurality of the second array of capacitor banks in parallel.

The IPD can be included in a variety of package configurations. In an embodiment, the IPD is bonded to the package routing with a plurality of solder bumps. The IPD may be laterally adjacent to a plurality of package solder bumps. In an embodiment, the IPD is within an interposer.

Capacitor banks with defective capacitors can be trimmed. In an embodiment, the IPD includes an array of terminals, and an array of fuses between the array of capacitor banks and the array of terminals. A defective capacitor bank can be disconnected by blowing the corresponding fuse(s). In an embodiment, the IPD includes an array of terminals, and an array of solder bumps on the array of terminals, and an insulating layer separating a terminal from a solder bump for a defective capacitor bank. This may be the case for multiple terminals.

In an embodiment, a method of testing an array of capacitor banks includes engaging a probe card on a substrate including an array of capacitor banks, in which each capacitor bank is electrically separate in the IPD, and the probe card includes a first array of probes on a first group of terminals for a first group of capacitor banks and a second array of probes on a second group of terminals for a second group of capacitor banks. For example, the substrate may be an IPD or wafer prior to singulation of a plurality of IPDs. The first group of capacitor banks and the second group of capacitor banks are tested separately for capacitance and leakage. The first and second groups of capacitor banks are then tested together to measure leakage between the first and second groups of capacitor banks. The probe card is then disengaged from the IPD. In this embodiment, the testing of an array of capacitor banks is accomplished by only two capacitor measurements, by having a checker-board-like configuration of the array of capacitor banks by design.

BRIEF DESCRIPTION OF THE DRAWINGS

FIG. 7 is a schematic cross-sectional side view illustration of a module including an integrated fan out package structure mounted on a circuit board in accordance with an embodiment.

FIG. 8 is a schematic cross-sectional side view illustration of a module including a 2.5D package structure mounted on a circuit board in accordance with an embodiment.

DETAILED DESCRIPTION

Figure 1:
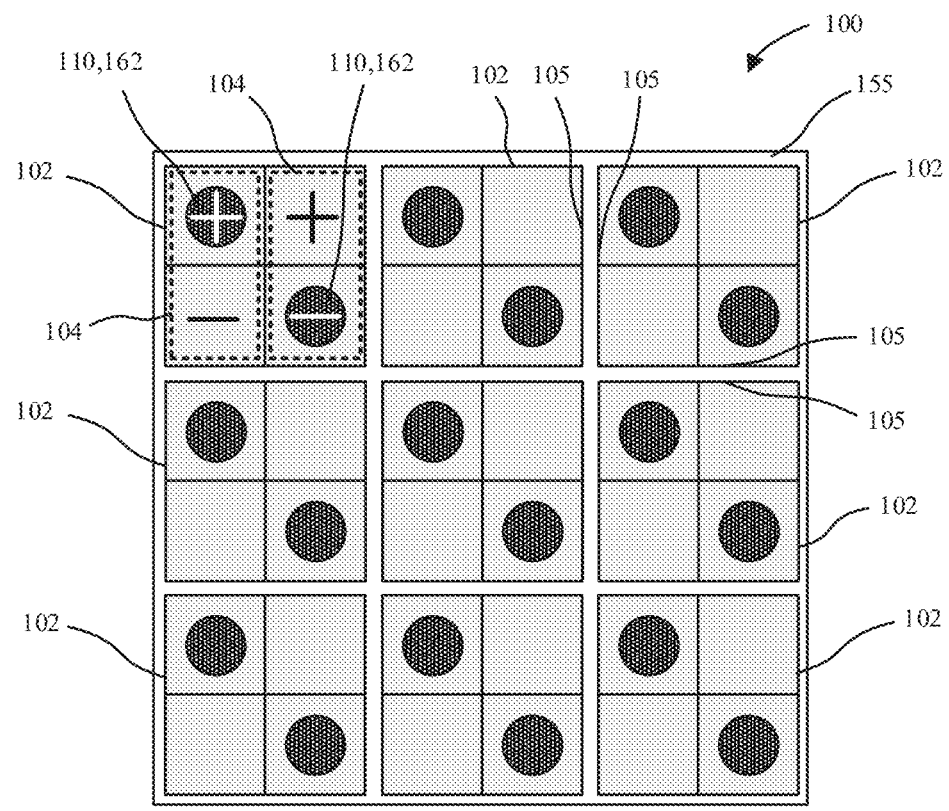
FIG. 1 is a schematic bottom face view illustration of terminals and solder bumps for an array of capacitor banks of an integrated passive device in accordance with an embodiment.

Embodiments describe integrated passive devices (IPDs) including trimmable capacitor banks, electronic package structures including such IPDs, and methods of testing such IPDs. It has been observed that as IPDs and capacitor arrays become increasingly larger to match growing performance demands, yield drops and recovering the IPDs by removing defective regions becomes attractive. In accordance with embodiments, the IPD capacitor arrays are divided into an array of electrically separate capacitor banks which can be re-assigned by package re-design. With the capacitor banks in accordance with embodiments, individual portions of the capacitor array can be trimmed from the IPD. Thus, defective portions can be removed so that overall circuit functionality is restored. Additionally, capacitance value of the IPD capacitor can be adjusted after manufacturing to meet changing system requirements. Conventional IPD capacitors may include an array of capacitors that are all connected and bumped out in parallel. The IPD capacitors in accordance with embodiment include an array of capacitor banks in which each capacitor bank of the array of capacitor banks is electrically separate in the IPD. Such a configuration can add flexibility to the IPD capacitor array design, reduce development effort by keeping form factor of the IPD unchanged, reduce cycle by not needing IPD re-tape-out and re-use of already fabricated banks, save cost, and allow for re-usability of a single design.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

In an embodiment, an integrated passive device includes a mounting surface including an array of terminals, an array of capacitor banks, and IPD routing connecting the array of capacitor banks to the array of terminals. In accordance with embodiments, each capacitor bank of the array of capacitor banks may be electrically separate.

An electronic package structure in an embodiment includes a first die including a first integrated circuit (IC), a package routing on the first die, and an IPD bonded to the package routing. The IPD includes an array of capacitor banks in which each capacitor bank of the array of capacitor banks is electrically separate in the IPD. The package routing may include a first interconnect electrically connected to the first IC and a first plurality of the array of capacitor banks in parallel.

The terms "above", "over", "to", "between", "spanning" and "on" as used herein may refer to a relative position of one layer with respect to other layers. One layer "above", "over", "spanning" or "on" another layer or bonded "to" or in "contact" with another layer may be directly in contact with the other layer or may have one or more intervening layers. One layer "between" layers may be directly in contact with the layers or may have one or more intervening layers.

Figure 2A:
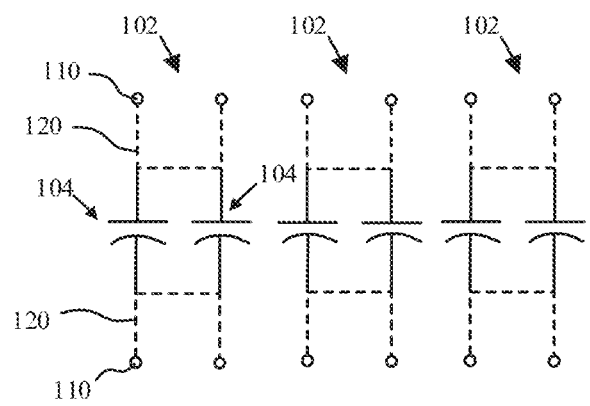
FIG. 2A is a schematic routing diagram for a row of capacitor banks of FIG. 1 in which each capacitor includes a pair of terminals in accordance with an embodiment.
Figure 2B:
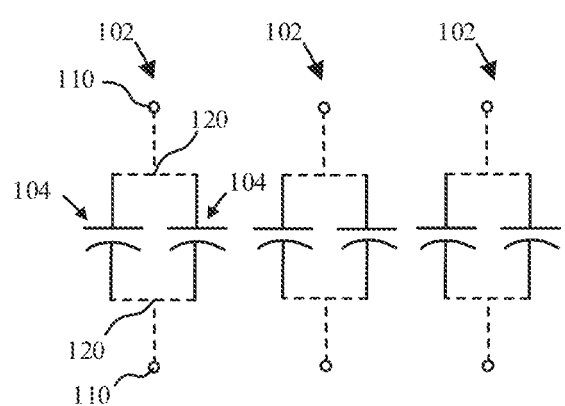
FIG. 2B is a schematic routing diagram for a row of capacitor banks of FIG. 1 in which each capacitor bank includes a pair of terminals in accordance with an embodiment.

FIG. 1 is a schematic bottom face view illustration of terminals and solder bumps for an array of capacitor banks of an integrated passive device 100 in accordance with an embodiment. Specifically, the bottom face view may be of the mounting surface 155 of the IPD. FIG. 2A is a schematic routing diagram for a row of capacitor banks 102 of FIG. 1 in which each capacitor 104 includes a pair of terminals 110 in accordance with an embodiment. FIG. 2B is a schematic routing diagram for a row of capacitor banks of FIG. 1 in which each capacitor bank 102 includes a pair of terminals 110 in accordance with an embodiment. As shown in FIG. 1, terminals 110 may be populated by solder bumps 162.

As schematically shown, the IPD 100 can include an array of capacitors 104 arranged into an array of capacitor banks 102, with each capacitor bank 102 being electrically separate from one another. In an embodiment, each capacitor bank 102 of the array of capacitor banks occupies a same amount of area. This may result in each edge 105 of each capacitor bank 102 abutting a maximum of one neighboring capacitor bank 102 edge 105. This may be useful for a checkerboard-like layout for testing. In the particular embodiment illustrated, each capacitor bank 102 occupies a square area. The capacitor banks 102 may have different capacitance values, such as an integer multiple or fraction of a unit capacitance value. Each capacitor bank 102 may additionally include multiple capacitors 104 in parallel. In an embodiment, an IPD 100 includes a mounting surface 155 including an array of terminals 110, an array of capacitor banks 102, and IPD routing 120 connecting the array of capacitor banks 102 to the array of terminals 110. As shown in FIGS. 2A-2B, each capacitor bank of the array of capacitor banks 102 is electrically separate in the IPD 100.

FIGS. 2A and 2B illustrate two options for IPD routing 120 in accordance embodiments. As shown in the embodiment illustrated in FIG. 2A, the array of terminals 110 includes a pair of terminals 110 for each corresponding capacitor 104. The number of terminals 110 may be less than the number of capacitors. As shown in the embodiment illustrated in FIG. 2B, the IPD routing 120 includes an array of capacitor bank 102 routings corresponding to the array of capacitor banks 102, and each capacitor bank routing includes a single pair of terminals 110. In both embodiments illustrated in FIGS. 2A-2B, the capacitors 104 in each capacitor bank 102 may be in parallel.

Figure 3:
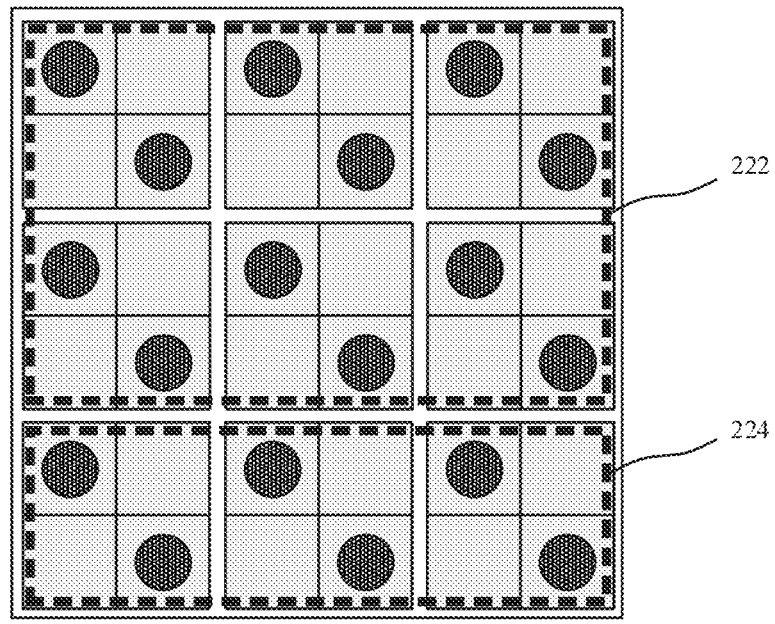
FIG. 3 is a schematic bottom face view illustration of two groups of capacitor banks connected to separate package interconnects in accordance with an embodiment.
Figure 4:
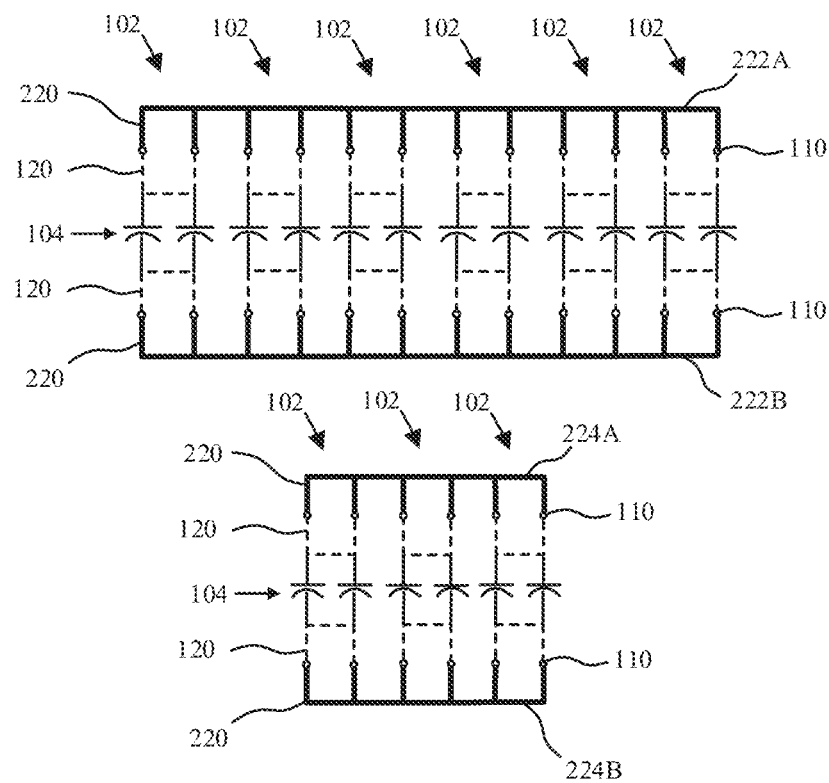
FIG. 4 is a schematic routing diagram of the two groups of capacitor banks, each connected in parallel to the separate package interconnects of FIG. 3 in accordance with an embodiment.

Referring now to FIGS. 3-4, FIG. 3 is a schematic bottom face view illustration of two groups of capacitor banks connected to separate package interconnects in accordance with an embodiment; FIG. 4 is a schematic routing diagram of the two groups of capacitor banks, each connected in parallel to the separate package interconnects of FIG. 3 in accordance with an embodiment. The IPD 100 in accordance with embodiments can be a portable design, irrespective of the package chip or IC design. Thus, capacitance use is determined at the package level and selection of the number of capacitor banks 102 to be tied together with package routing interconnects. In the embodiment illustrated in FIG. 3 the top two rows of capacitor banks are tied together in parallel with package routing 220 interconnect 222, while the bottom row of capacitor banks is tied together in parallel with package routing 220 interconnect 224. A schematic routing diagram of this arrangement is illustrated in FIG. 4, where interconnect 222 includes rails 222A, 222B connected to opposite terminals 110 of the capacitor banks 102 in parallel. Likewise interconnect 224 includes rails 224A, 224B connected to opposite terminals 110 of the bottom row of capacitor banks 102 in parallel. While the particular routing configuration illustrated in FIG. 4 includes IPD routing 120 similar to that provided in FIG. 2A, embodiments are not so limited. For example, the routing configuration illustrated in FIG. 4 may include IPD routing 120 of FIG. 2B.

Figure 5:
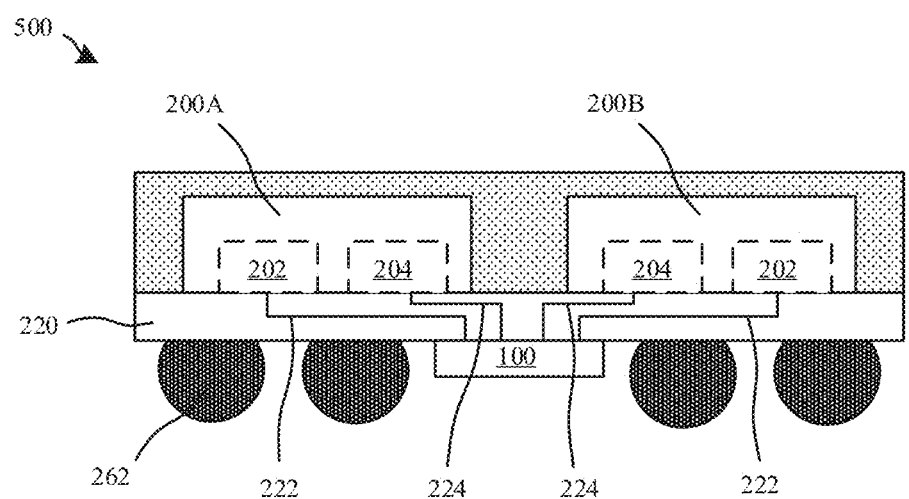
FIG. 5 is a schematic cross-sectional side view illustration of an electronic package structure including package routing connecting multiple dies to an integrated passive device in accordance with an embodiment.
Figure 6:
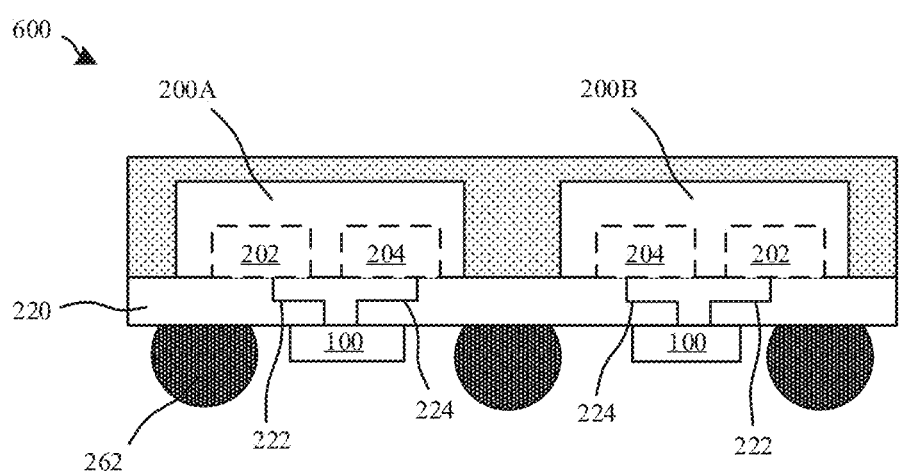
FIG. 6 is a schematic cross-sectional side view illustration of an electronic package structure including package routing connecting multiple dies and multiple integrated passive devices in accordance with an embodiment.

The electrically separate interconnects 222, 224 in accordance with embodiments may be connected to separate ICs within a same die, or separate ICs within separate dies. Referring now to FIGS. 5-6, FIG. 5 is a schematic cross-sectional side view illustration of an electronic package structure including package routing connecting multiple dies to an integrated passive device in accordance with an embodiment. FIG. 6 is a schematic cross-sectional side view illustration of an electronic package structure including package routing connecting multiple dies and multiple integrated passive devices in accordance with an embodiment. As shown in the two configurations, the electronic package 500, 600 structure may include a first die 200A including a first IC 202, and package routing 220 on the first die, and an IPD bonded to the package routing 220. The package routing may be a single or multiple layer routing. As described above, the IPD 100 includes an array of capacitor banks 102, an array of terminals 110, and IPD routing 120 connecting the array of capacitor banks 102 to the array of terminals 110. Each capacitor bank 102 may be electrically separate in the IPD 100.

The package routing 220 in accordance with embodiments may include a first interconnect 222 electrically connected to the first IC 202 and a first plurality of the array of capacitor banks 102 in parallel. Still referring to FIGS. 5-6, the first die 202 may also include a second IC 204, and the package routing 220 includes a second interconnect 224 that is electrically connected to the second IC 204 and a second plurality of the array of capacitor banks 102 in parallel. The first and second interconnects 222, 224 may be electrically separate so as to separately supply ICs 202, 204, respectively. The electronic package may further include a second die 200B including additional ICs 202, 204 with the package routing 220 additionally on the second die 200B. As shown, the package routing 220 can span across both dies 200A, 200B, and connect one or more IPDs 100 with one or more dies.

In the particular embodiment illustrated in FIG. 5, the package routing 220 additionally includes a first interconnect 222 and second interconnect 224 electrically connected to the second IC 204. In the particular embodiment illustrated in FIG. 6, a second IPD 100 is bonded to the package routing 220. The second IPD 100 can include a second array of second capacitor banks similar to the first array of first capacitor banks of the first IPD 100. Each of the second capacitor banks may likewise be electrically separate in the second IPD. As shown, the second IPD 100 may be connected to multiple package interconnects 222, 224 to multiple ICs 202, 204 of the second die 200B.

The IPDs 100 in accordance with embodiments may be packaged using a variety of electronic package structures in accordance with embodiments. Referring now to FIG. 7, a schematic cross-sectional side view illustration is provided of an integrated fan-out package configuration of an IPD in accordance with embodiments. FIG. 7 is similar to FIGS. 5-6. As shown, package 700 includes a die 200 on package routing 220, which may a redistribution layer, and encapsulated in a molding compound 210. Die 200 is illustrated as a system on chip (SOC), including a general processing unit (GPU) 202 core and central processing unit (CPU) 204 core. BGA solder bumps 262 are provided on the opposite side of package routing 220 for mounting onto circuit board 300. In the integrated fan-out package configuration illustrated, IPD 100 is also mounted onto the opposite side of the package routing 220 laterally adjacent to the BGA solder bumps 262. For example, IPD 100 is mounted onto package routing 220 with solder bumps 162 (see FIG. 13, for example), which may be micro-bumps. In an embodiment, the integrated fan-out package configuration may be implemented to support a reasonable bump density and low package height. The IPDs 100 in accordance with embodiments may additionally include through silicon vias (TSVs) for optional backside connection. In such a configuration, solder bumps 164 may be placed on the back side of the IPD 100 for connection to the circuit board 300.

FIG. 8 is a schematic cross-sectional side view illustration of a 2.5D packaging integration for the IPD in accordance with embodiments. As illustrated, the package 800 includes a die 200 on a package routing 220 and encapsulated in a molding compound 210. A plurality of IPDs 100 are mounted on the package routing 220 with a plurality of micro-bumps and encapsulated within a molding compound 230. TSVs may optionally be formed in the IPDs 100, and through mold vias 232 may optionally be formed through the molding compound 230 between package routing 220 and RDL 240 formed on an opposite side. The package routing 220, RDL 240 molding compound 230, and through mold vias 232 may form an interposer layer 810. In some embodiments, molding compound 230 can be replaced with various interposer wiring and insulator layers. A plurality of BGA solder balls 262 may be formed on RDL 240 for mounting onto circuit board 300. In an embodiment, the 2.5D packaging configuration may be implemented to support a reasonable bump density with higher package height.

In one aspect, individual portions, or capacitor banks 102, of the IPD 100 can be trimmed from the IPD 100 prior to packaging. For example, trimming can be performed to remove defective portion of the capacitor array so that overall circuit functionality is restored. Additionally, trimming can be performed to adjust capacitance value of the IPD 100 after manufacturing to meet changing system requirements.

Figure 9:
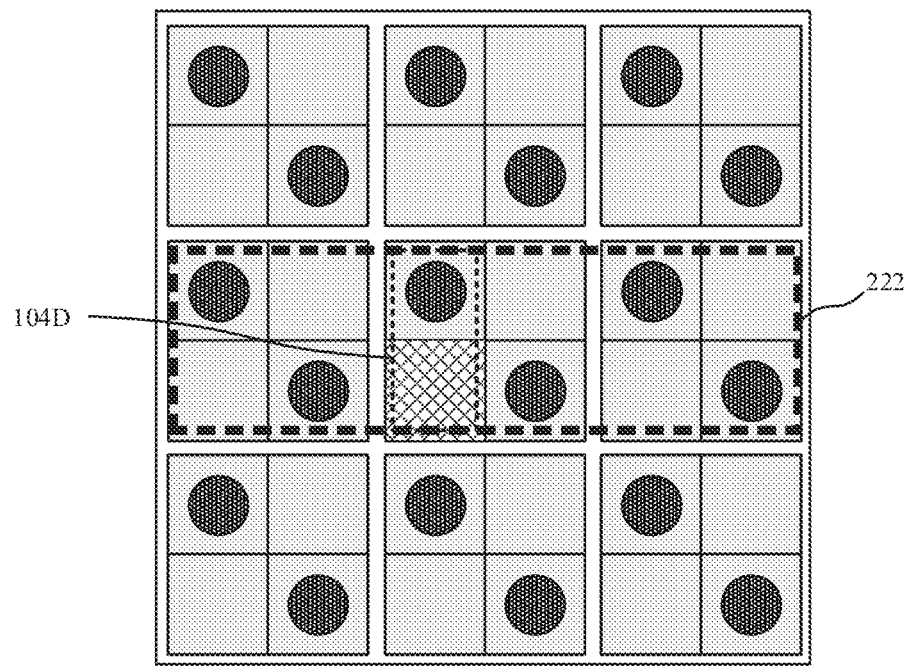
FIG. 9 is a schematic bottom face view illustration an integrated passive device with a defective capacitor bank in accordance with an embodiment.
Figure 10:
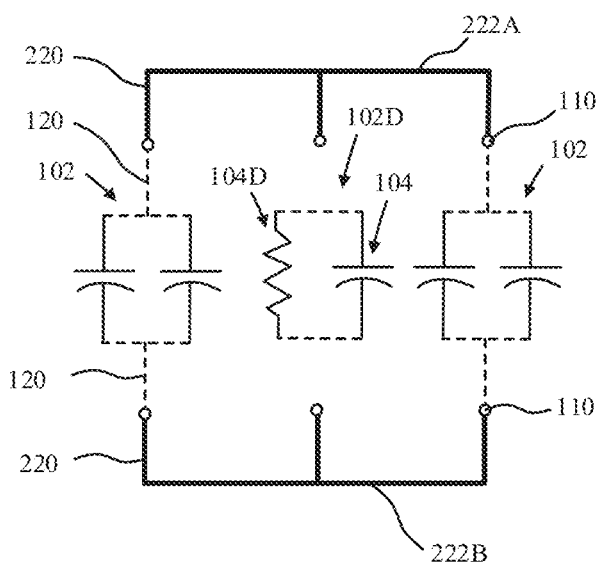
FIG. 10 is a schematic routing diagram of a row of capacitor banks of FIG. 9 including a defective capacitor bank in accordance with an embodiment.

FIG. 9 is a schematic bottom face view illustration an integrated passive device with a defective capacitor bank in accordance with an embodiment. FIG. 10 is a schematic routing diagram of a row of capacitor banks of FIG. 9 including a defective capacitor bank in accordance with an embodiment. Specifically, FIG. 9 illustrates middle row of capacitor banks 102 that may be assigned to a package routing interconnect 222. In the exemplary illustrations provided, the middle row of capacitor banks includes a defective capacitor 104D, and hence a defective capacitor bank 102D. The IPD routing 120 in accordance with embodiments may be modified in accordance with embodiments to trim the defective capacitor bank 102 so that it will not be electrically connected to interconnect 222 (including rails 222A, 222B) in the eventual package routing 220. This may be achieved in a number of ways. In some embodiments, the IPD routing 120 is modified to trim the defective capacitor bank 102D. Alternatively, trimming may be performed with die logic.

Figure 11:
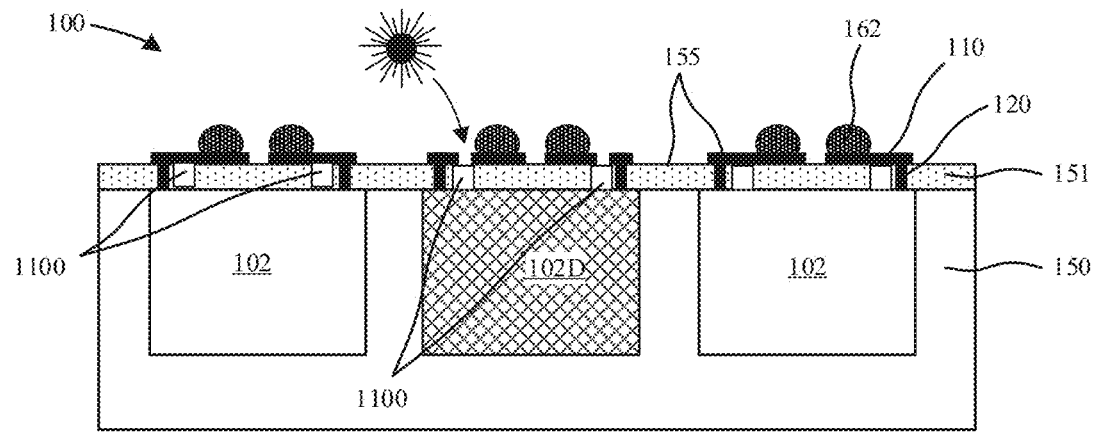
FIG. 11 is a schematic cross-sectional side view illustration of a defective capacitor bank trimmed with a fuse in accordance with an embodiment.

FIG. 11 is a schematic cross-sectional side view illustration of a defective capacitor bank trimmed with a fuse in accordance with an embodiment. As shown, the IPD 100 may include a substrate 150, such as silicon substrate, a plurality of capacitor banks 102 formed in the substrate 150, an encapsulation layer 151, and IPD routing 120 connecting the capacitor banks 102 to an array of terminals 110, which may be contact pads. An array of solder bumps 162 can be placed onto the array of terminals. In an embodiment, the IPD routing 120 can be trimmed to electrically separate the terminals 110 from a corresponding defective capacitor bank 102. In an embodiment such as that illustrated in FIG. 11, the IPD 100 includes an array of fuses 1100 between the array of capacitor banks 102 and the array of terminals 110. The fuses 1100 for a corresponding defective capacitor bank 102 can be blown (e.g. by laser) to electrically separate the terminals 110 from the defective capacitor bank 102D.

Figure 12:
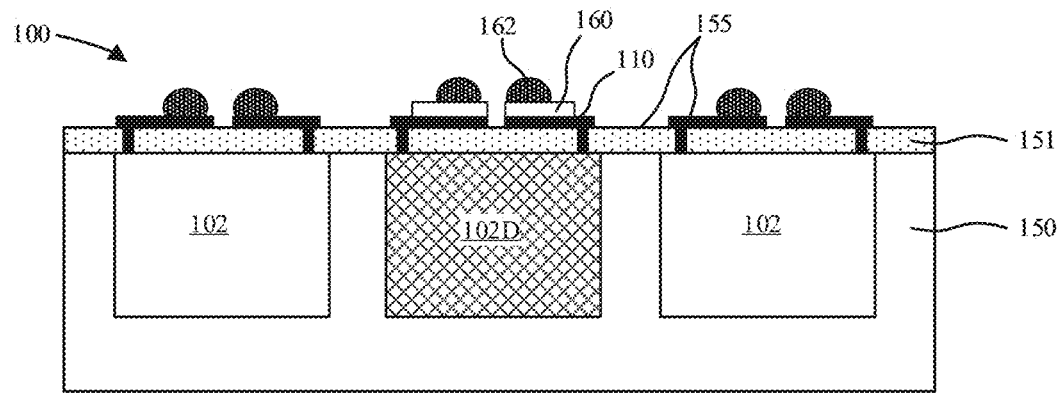
FIG. 12 is a schematic cross-sectional side view illustration of terminals for a defective capacitor bank covered with an insulator in accordance with an embodiment.

FIG. 12 is a schematic cross-sectional side view illustration of terminals for a defective capacitor bank covered with an insulator in accordance with an embodiment. As illustrated, the IPD 100 includes an array of solder bumps 162 on an array of terminals 110, and an insulating layer 160 covering terminals 110 for a defective capacitor bank 102D so that the insulating layer 160 physically and electrically separates the terminals 110 from the solder bumps 162. For example, after wafer-level testing and identification of defective capacitor banks 102D, but before bump plating, a selective deposition method can be used to place the insulator layer 160 over the terminals 110, or contact pads, corresponding to the defective capacitor bank 102D.

Figure 13:
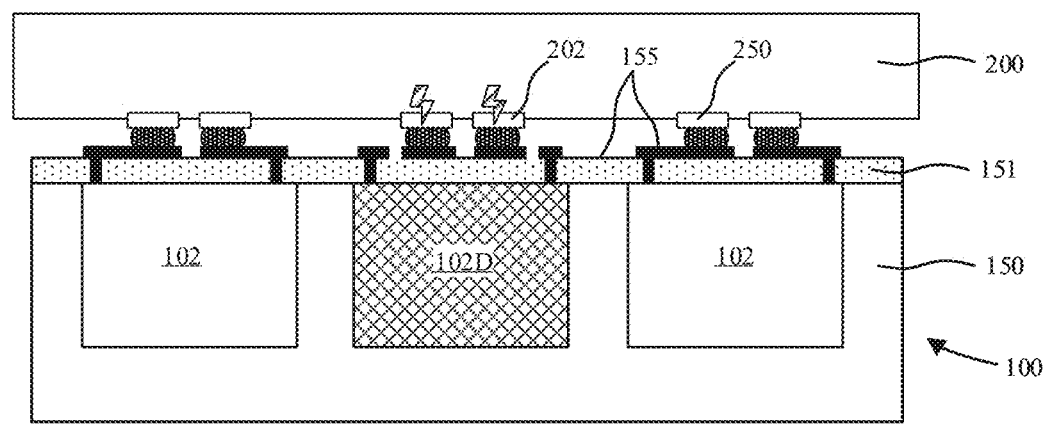
FIG. 13 is a schematic cross-sectional side view illustration of a module with defective capacitor bank trimmed with a package fuse in accordance with an embodiment.

FIG. 13 is a schematic cross-sectional side view illustration of a module with defective capacitor bank trimmed with a package fuse in accordance with an embodiment. In such an embodiment, after system-level testing an identification of defective capacitor banks 102D, an electronic fuse can be blown with the die 200 logic. This may have the effect of disconnecting pads 250 of package routing 220 from the die 200.

In one aspect, the capacitor bank 102 arrangement in accordance with embodiments can potentially reduce testing time required for the IPD compared to arrangements with pre-routed capacitors. For example, test time can be correlated to the number of different rails, or groupings of capacitor banks 102. However, since the capacitor banks 102 are all electrically separate in the IPD 100 in accordance with embodiments, the capacitor banks 102 can be grouped based on test preference, whether this is electrical design or physical layout.

Figure 14A:
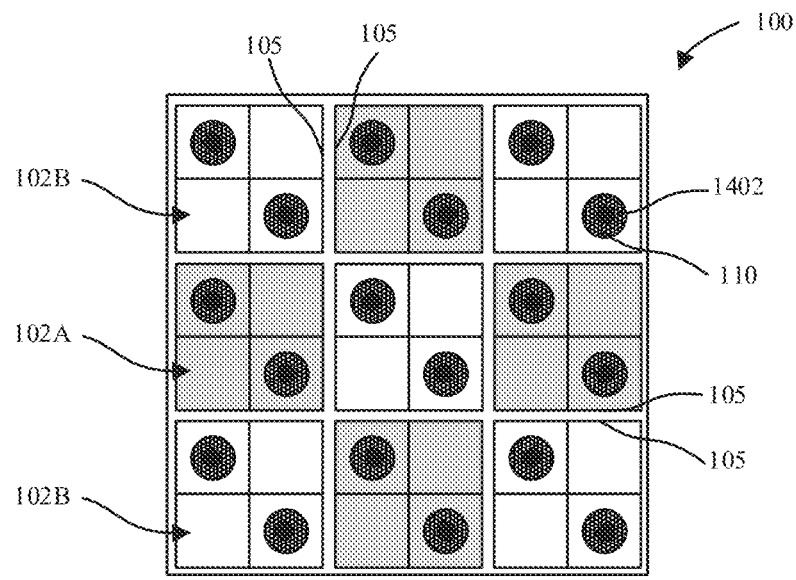
FIG. 14A is a schematic bottom face view illustration of probe placement during testing of an integrated passive device in accordance with the method of FIG. 14B in accordance with an embodiment.
Figure 14B:
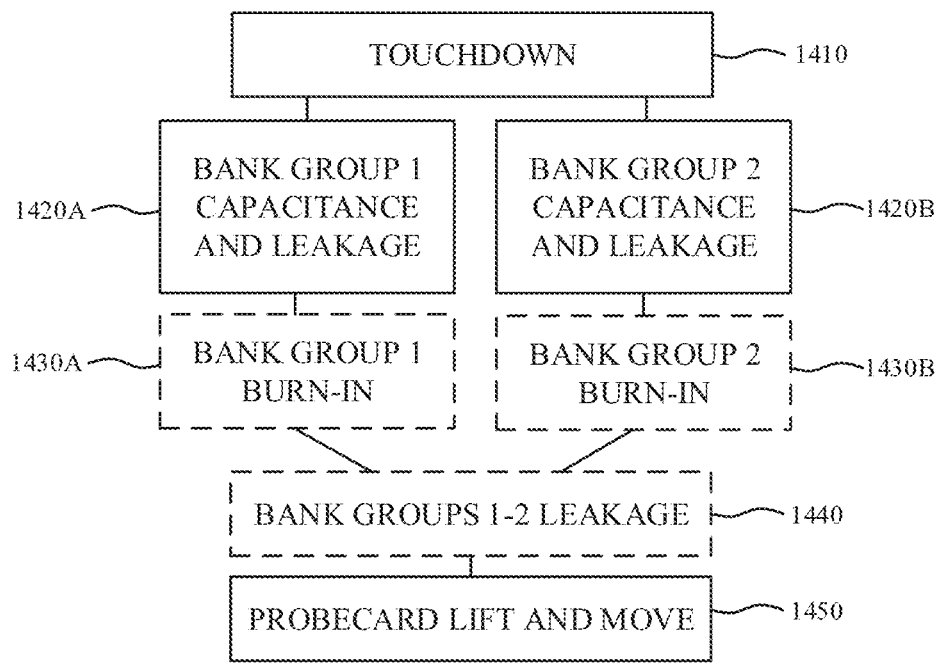
FIG. 14B is a flow chart of a method of testing an integrated passive device in accordance with an embodiment.

FIG. 14A is a schematic bottom face view illustration of probe placement during testing of an integrated passive device in accordance with the method of FIG. 14B in accordance with an embodiment. FIG. 14B is a flow chart of a method of testing an integrated passive device in accordance with an embodiment. Referring now to FIG. 14A, probe landing sites 1402 are illustrated in an exemplary embodiment. As shown, a probe card may be designed to include probes with landing sites 1402 that correspond to the IPD terminals 110 for each capacitor bank 102. Since the capacitor banks 102 are electrically separate in the IPD 100, the probe card can be designed to include probes for each capacitor bank. For example, each capacitor bank 102 may include a terminal for Vdd (high voltage contact) probe and Vss (low voltage contact) probe. In the particular arrangement illustrated in FIG. 14A, the capacitor banks 102 are separated into two groups (by probe card design). Additional groups can be used, which may provide additional accuracy, with additional test time. In an embodiment, groups 102A, 102B of the capacitor banks 102 are arranged in a checkerboard pattern. In the particular embodiment illustrated each capacitor bank 102 occupies a same area, and each capacitor bank's edge 105 abuts a maximum of one capacitor bank edge 105.

In an embodiment, the IPD 100 is expected to pass testing if the total capacitance of each group is on target, there is no short to ground anywhere on the capacitor, and there is no short between groups 102A, 102B. Total capacitance and short to ground can be determined with two tests that test full capacitance and leakage. For shorting between groups 102A, 102B, shorting in theory is only expected between neighbor capacitor banks. Accordingly, the test method in accordance with embodiments is to verify if nearest neighbor bank cells are not shorted.

Referring now to FIG. 14B, at operation 1410 a probe card is engaged with a substrate (e.g. IPD or wafer including an array of IPDs) including an array of capacitor banks, in which each capacitor bank is electrically separate in the IPD, and the probe card includes a first array of probes on a first group of terminals for a first group of capacitor banks and a second array of probes on a second group of terminals for a second group of capacitor banks. The first group of capacitor banks and the second group of capacitor banks are each tested separately for capacitance and leakage at operations 1420A, 1420B. Capacitance testing may test total capacitance of each group. Leakage testing may be at the operating voltage of the capacitors. The first and second groups may then optionally be tested with burn-in tests at operations 1430A, 1430B in which a high voltage is applied and leakage measured. This may screen out infant mortality. At operation 1440, leakage may be tested between the first and second groups. This may be used to test for shorts between banks and ensure the two groups are isolated from each other. The probe card is then disengaged from the IPD at operation 1450.

Testing of the multi-banked IPDs in accordance with embodiments may ensure that (1) none of the banks have Vdd–Vss (high voltage terminal–low voltage terminal) shorts, (2) all capacitor banks are on target for capacitance and (3) there are no shorts between capacitor banks. To ensure the first two, it may be sufficient to measure the total capacitance and leakage for each bank group at operations 1420A, 1420B. If these tests pass, then it may not be necessary to perform bank group-to-bank group leakage tests. However, if the tests fail or are inconclusive embodiments may check bank group-to-bank group leakage to seek of the bank groups truly lad to each other or if capacitance fails. In order to test for shorts between capacitor banks, the testing method in accordance with embodiments can avoid testing leakage between every pair of capacitor banks. In accordance with embodiments, it is presumed that if nearest neighbor capacitor banks are not shorted then no banks will be shorted, since short causing defects are most likely much smaller than capacitor banks. So the testing method in accordance with embodiments may only check leakage between nearest neighbor capacitor banks. For randomly designed capacitor banks, this can be difficult, however, the capacitor banks in accordance with embodiments may be designed such that each edge of each capacitor bank abuts only one neighboring capacitor bank edge. This allows dividing the capacitor banks into two groups, and ganging each group together to measure leakage between the two groups at operation 1440. If this test passes then the capacitor banks do not have any back-to-bank shorts. To make this design, it is not necessary that the capacitor banks to have an equal capacitance value, nor equal physical extent. In accordance with embodiments, the capacitor bank edges lie on a Manhattan grid.

The testing methodology in accordance with embodiments can be further developed for capacitor designs that do not follow this simplest banking—where one capacitor bank's edge may abut more than one capacitor bank edge for example, and most of these problems can be solved by simply dividing the capacitor banks into more groups (e.g. more than two) and measuring the leakage between those groups. However, as the number of groups goes up the benefit of this method starts to diminish. Thus, the capacitor unit layout in accordance with many embodiments may be a checkerboard design, where all capacitor banks are the same size (e.g. occupy a same area) and abut a maximum of one neighboring capacitor bank on each edge.

In utilizing the various aspects of the embodiments, it would become apparent to one skilled in the art that combinations or variations of the above embodiments are possible for forming a trimmable banked capacitor structure. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. An electronic package structure comprising:
a first die including a first integrated circuit (IC);
a package routing on the first die;
an integrated passive device (IPD) bonded to the package routing, the IPD including an array of capacitor banks, an array of terminals, and IPD routing connecting the array of capacitor banks to the array of terminals, wherein each capacitor bank of the array of capacitor banks is electrically separate in the IPD and each capacitor bank comprises multiple capacitors in parallel;
wherein the package routing includes a first interconnect electrically connected to the first IC and a first plurality of the array of capacitor banks in parallel.

2. The electronic package of claim 1, wherein each capacitor bank of the array of capacitor banks occupies a same amount of area, and each edge of each capacitor bank abuts a maximum of one neighboring capacitor bank edge.

3. The electronic package of claim 1, wherein the array of terminals comprises a pair of terminals for each corresponding capacitor.

4. The electronic package of claim 1, wherein the IPD comprises a corresponding pair of terminals for each capacitor bank.

5. The electronic package structure of claim 1, wherein the IPD is bonded to the package routing with a plurality of solder bumps.

6. The electronic package structure of claim 5, wherein the IPD is laterally adjacent to a plurality of package solder bumps.

7. The electronic package structure of claim 5, wherein the IPD and the second IPD are laterally adjacent to a plurality of package solder bumps.

8. The electronic package structure of claim 1, wherein the IPD is within an interposer.

9. The electronic package structure of claim 1, wherein the IPD comprises an array of fuses between the array of capacitor banks and the array of terminals.

10. The electronic package of claim 1, wherein the IPD comprises an array of solder bumps on the array of terminals, and further comprising an insulating layer separating a terminal from a solder bump for a defective capacitor bank.

11. The electronic package structure of claim 1, wherein the IPD and the second IPS are within an interposer.

12. An integrated passive device (IPD) comprising:
a mounting surface including an array of terminals;
an array of capacitor banks;
IPD routing connecting the array of capacitor banks to the array of terminals;
wherein each capacitor bank of the array of capacitor banks is electrically separate; and
a structure for trimming the array of capacitor banks selected from the group consisting of:
an array of fuses between the array of capacitor banks and the array of terminals; and
an array of solder bumps on the array of terminals, and further comprising an insulating layer separating at least one terminal from a corresponding solder bump for a defective capacitor bank.

13. The integrated passive device of claim 12, wherein each capacitor bank of the array of capacitor banks occupies a same amount of area, and each edge of each capacitor bank abuts a maximum of one neighboring capacitor bank edge.

14. The integrated passive device of claim 12, wherein each capacitor bank comprises multiple capacitors in parallel.

15. The integrated passive device of claim 14, wherein the IPD comprises a corresponding pair of terminals for each capacitor bank.

16. The integrated passive device of claim 14, wherein the array of terminals comprises a pair of terminals for each corresponding capacitor.

17. The integrated passive device of claim 12, comprising the array of fuses between the array of capacitor banks and the array of terminals.

18. The integrated passive device of claim 12, comprising the array of solder bumps on the array of terminals, and comprising the insulating layer separating the at least one terminal from the corresponding solder bump for the defective capacitor bank.

19. An electronic package structure comprising:
a first die including a first integrated circuit (IC);
a package routing on the first die;
an integrated passive device (IPD) bonded to the package routing, the IPD including an array of capacitor banks, an array of terminals, and IPD routing connecting the array of capacitor banks to the array of terminals, wherein each capacitor bank of the array of capacitor banks is electrically separate in the IPD;
a second IC;
wherein the package routing includes a first interconnect electrically connected to the first IC and a first plurality of the array of capacitor banks in parallel, and a second interconnect electrically connected to the second IC and a second plurality of the array of capacitor banks in parallel; and
wherein the first die further comprises the second IC, or a second die comprises the second IC and the package routing is additionally on the second die.

20. The electronic package of claim 19, wherein:
the first die further comprises the second IC.

21. The electronic package of claim 19, wherein:
the second die comprises the second IC and the package routing is additionally on the second die.

22. An electronic package structure comprising:
a first die including a first integrated circuit (IC);
a second die including a second IC;
a package routing on the first die and the second die;
an integrated passive device (IPD) bonded to the package routing, the IPD including an array of capacitor banks, an array of terminals, and IPD routing connecting the array of capacitor banks to the array of terminals, wherein each capacitor bank of the array of capacitor banks is electrically separate in the IPD;
a second IPD bonded to the package routing, wherein the second IPD includes a second array of second capacitor banks, wherein each second capacitor bank is electrically separate in the second IPD;
wherein the package routing includes a first interconnect electrically connected to the first IC and a first plurality of the array of capacitor banks in parallel, and a second interconnect electrically connected to the second IC and a second plurality of the second array of second capacitor banks in parallel.

23. The electronic package structure of claim 22, wherein the IPD and the second IPD are bonded to the package routing with a plurality of solder bumps.

* * * * *